United States Patent
Papadas et al.

[11] Patent Number: 6,018,475
[45] Date of Patent: Jan. 25, 2000

[54] MOS MEMORY POINT

[75] Inventors: Constantin Papadas, Gieres; Jean-Pierre Schoellkopf, Grenoble, both of France

[73] Assignee: STMicroelectronics S.A., Saint Genis, France

[21] Appl. No.: 09/173,326

[22] Filed: Oct. 15, 1998

[30] Foreign Application Priority Data

Oct. 20, 1997 [FR] France .................................. 97 13317

[51] Int. Cl.[7] .................................................. G11C 11/34
[52] U.S. Cl. ............................................ 365/174; 365/181
[58] Field of Search .................................. 365/174, 177, 365/181, 189.01, 185.18, 185.27

[56] References Cited

U.S. PATENT DOCUMENTS 5,329,481  7/1994  Seevinck et al. ........................ 365/174
5,434,816  7/1995  Levi ......................................... 365/174
5,796,650  8/1998  Wik et al. ................................ 365/174

*Primary Examiner*—Son T. Dinh
*Attorney, Agent, or Firm*—Wolf, Greenfield & Sacks, P.C.

[57] ABSTRACT

The present invention relates to the use of a conventional MOS transistor as a memory point in which, during programming, the well of the MOS transistor is connected to a reference potential, the drain and the source are connected to a current source adapted to bias the drain and source junctions in reverse and in avalanche so that the space charge region extends along the entire channel length, the gate is set to the reference potential if the memory point does not have to be programmed and to a distinct potential if the memory point has to be programmed; and during the reading, circuitry is provided to detect a high or low impedance state between the gate and the well.

3 Claims, 2 Drawing Sheets

MOS MEMORY POINT

BACKGROUND OF THE INVENTION

1. Field of the Invention

The present invention relates to a permanent memory point compatible with a conventional CMOS technology.

2. Discussion of the Related Art

When a permanent memory point is desired to be implemented in an integrated circuit, technologies which use double gates and are not compatible with simple methods of implementation of CMOS integrated circuits are generally used. Thus, in a circuit implemented in conventional CMOS technology, to permanently store information, either memory points which are not electrically programmable, implementable by masking upon manufacturing of the circuit, or memory points of fuse type which melt at the passing of a current and the low or high impedance state of which is then detectable, are used. However, these elements have the disadvantage of occupying a relatively large space and of not always being reliable.

SUMMARY OF THE INVENTION

Thus, an object of the present invention is to provide a memory point in a CMOS technology which is of small dimension.

Another object of the present invention is to provide such memory points which can be assembled in an array and which are simply programmable and electrically addressable.

To achieve these and other objects, the present invention uses, as a memory point, a MOS transistor of minimum size, the gate-well resistance of which can be modified by a current flowing from the drain and the source to the well, the memory point being programmed or not according to the state of its gate during the programming phase.

More specifically, the present invention uses a conventional MOS transistor as a memory point in which, during the programming, the well of the MOS transistor is connected to a reference potential, the drain and the source are connected to a current source adapted to bias the drain and source junctions in reverse and in avalanche so that the space charge region extends along the entire channel length, the gate is set to the reference potential if the memory point does not have to be programmed and to a distinct potential if the memory point has to be programmed; and during reading, means are provided to detect a high or low impedance state between the gate and the well.

According to an embodiment of the present invention, the gate length of the MOS transistor is lower than 0.5 $\mu$m.

According to an embodiment of the present invention, the MOS transistor is a P-channel transistor formed in an N well of a P-type epitaxial layer.

The foregoing objects, features and advantages of the present invention, will be discussed in detail in the following non-limiting description of specific embodiments in connection with the accompanying drawings.

BRIEF DESCRIPTION OF THE DRAWINGS

FIG. 5 shows the use of a memory point according to the present invention for programming a flip-flop taking a determined state upon power-on.

DETAILED DESCRIPTION

Figure 1:
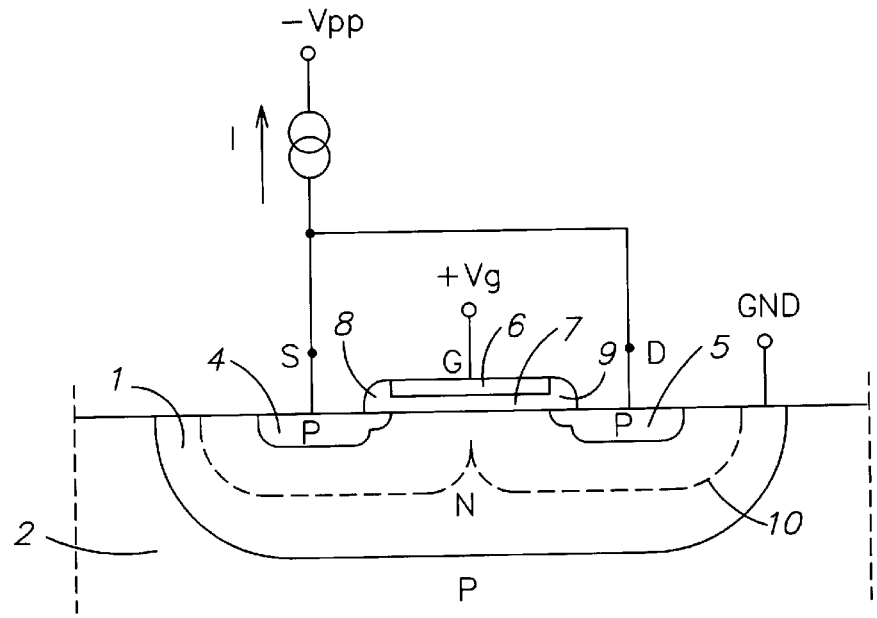
FIG. 1 shows a simplified cross-sectional view of a memory point according to the present invention.

FIG. 1 schematically shows a cross-sectional view of a MOS transistor manufactured according to conventional CMOS circuit manufacturing techniques. The MOS transistor of FIG. 1 is a P-channel MOS transistor formed in an N-type well 1 itself formed in a P-type substrate 2, generally an epitaxial layer. Reference 4 designates a P-type source diffusion, reference 5 designates a P-type drain diffusion, reference 6 designates a conductive gate formed above a channel region of the MOS transistor with the interposition of a layer of a gate insulator 7. Conventionally, spacers 8 and 9 are provided on either side of the gate to define LDD-type source and drain regions. In modem technologies, the channel length, that is, the distance between the regions facing the source and the drain, is lower than 0.5 $\mu$m, for example on the order of 0.35 $\mu$m. Thus, the transistor shown in FIG. 1 has no difference with conventional P-channel transistors formed in an N well in a CMOS technology where the N transistors are however formed directly in epitaxial layer 2.

The transistor according to the present invention is different from prior transistors by its use and the biasing applied thereto.

Well N is set to a reference potential GND, currently the ground. It should be recalled that, conversely, the N well of the P-channel transistors of a CMOS circuit is connected to the highest positive potential of the circuit, currently referred to as VDD.

To program the memory point formed by the transistor shown in FIG. 1, a current is applied between well 1 and the drain and source assembly which is connected to a negative potential –Vpp via a current source I. The voltage is sufficient to reverse and avalanche the PN junctions of the drain and the source. If the transistor is sufficiently small, the space charge region associated with the junctions in avalanche extends as is shown by dotted line 10 along the entire channel length under the gate. Thus, this area forms a high energy hot carrier reservoir. The state of the memory point during this programming can be chosen according to the potential Vg applied to gate G. If potential Vg is at reference potential GND, the hot carriers will not be attracted by the gate and nothing occurs. Conversely, if the gate is set to a potential Vg distinct from that of the substrate, this gate will attract electrons if its potential is positive or holes if its potential is negative. In both cases, the crossing of thin insulating layer 7, currently an oxide layer, by these high energy free carriers will change the insulation characteristics of the thin insulating layer which will then become relatively conductive, and at the limit will cause a puncture of this thin layer. Of course, preferably, a positive potential close to VDD will be applied to the gate since it is simpler in practical applications as will be seen hereafter.

To read the memory point, the drain and the source of potential –Vpp are disconnected and, either they are left unconnected, or, preferably, they are connected to reference potential GND. Then, during each reading operation, a voltage Vg is applied on the gate and the current flowing between the gate and the well is detected. A low current will correspond to an unprogrammed memory point and a higher current will correspond to a programmed memory point.

In other words, the memory point according to the present invention forms an anti-fuse, that is, a component which normally has a high impedance and the impedance of which drops to a low value after a programming.

Tests performed by the applicant on P-channel MOS transistors of a gate length of 0.35 μm have yielded particularly satisfactory results. For programming, well 1 has been connected to the ground (0 volt), a current source I of 8 milliamperes has been chosen, and either a null voltage (0 volt) or a programming voltage of 2.7 V (this 2.7 V voltage corresponding to the normal supply voltage VDD of the circuit (3.5 V) minus a transistor threshold voltage) have been applied to the gate. Then, during the read phase, the well, the source, and the drain have been set to 0 V and 2.7 V have been applied to the gate. A current on the order of $10^{-2}$ to $10^{-3}$ amperes (1 to 10 mA) has been found for a programmed device and a current of $10^{-10}$ to $10^1$ 1 amperes (10 to 100 pA) has been found for an unprogrammed device. The threshold difference between the programmed and unprogrammed devices is particularly high (higher than 6 decades). Of course, this is only a specific example implemented by the applicant on a simple experimental device and, depending upon the CMOS manufacturing technologies used, these results could be somewhat different.

Figure 2:
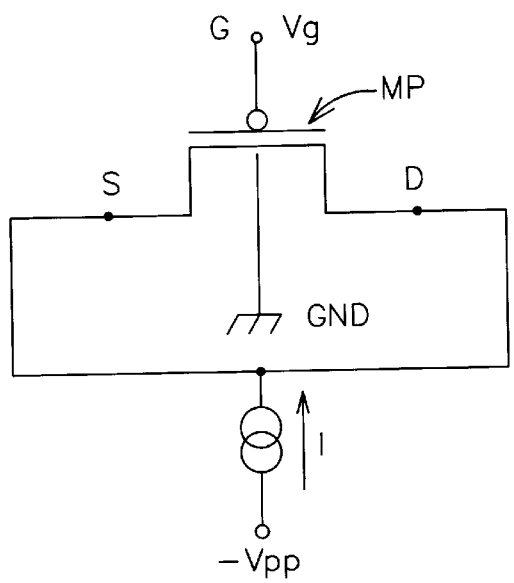
FIG. 2 shows the schematic electric diagram of a memory point according to the present invention.

FIG. 2 shows the equivalent electric diagram of the component of FIG. 1. Memory point MP is represented by a P-channel MOS transistor, the source and the drain of which are connected to a current source I (during the programming phase) and the well of which is connected to ground GND.

Figure 3:
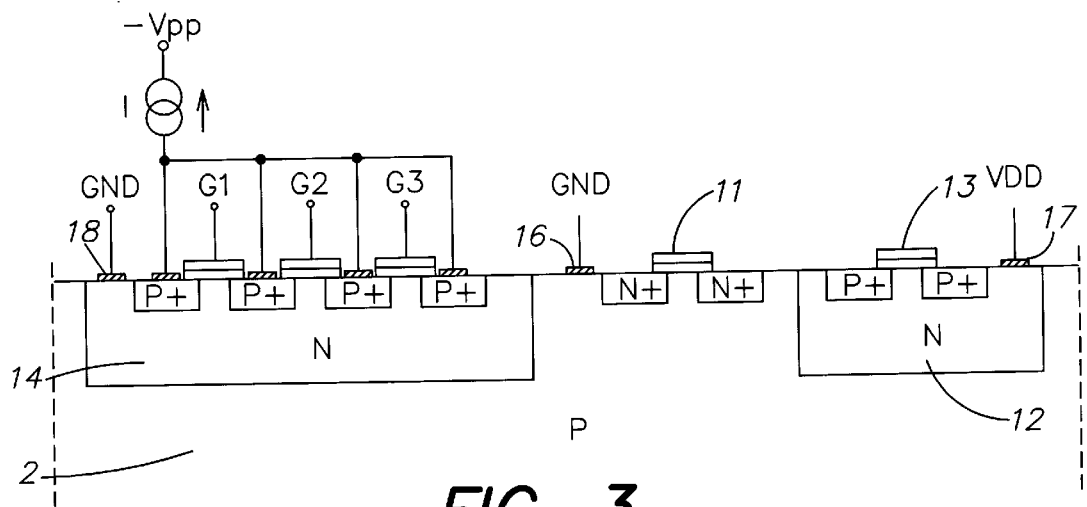
FIG. 3 shows a cross-sectional view of an assembly of memory points according to the present invention associated with two complementary MOS transistors.

FIG. 3 shows a simplified cross-sectional view of a portion of an integrated CMOS circuit. This drawing is extremely simplified and only aims at showing that there is no specific problem of isolation of the memory points according to the present invention with respect to the other circuit components. Especially, no spacers have been shown around the transistor gates. In this drawing, on the right-hand side and side-by-side in a P-type substrate 2 (an epitaxial layer), an N-channel MOS transistor 11 and, in an N-type well 12, a P-channel MOS transistor 13, can be seen. The memory points according to the present invention are formed in an N-type well 14. Three memory points, the gates of which are referred to as G1, G2, and G3 have been shown. The drains and sources are connected together to a current source I connected to a voltage source −Vpp. Conventionally, substrate (epitaxial layer) 2 is connected via a contact 16 to the ground and well 12 of P-channel transistors 13 is connected via a metallization 17 to potential VDD. Well 14 is connected via a metallization 18 also to ground GND. It can be seen that there is no problem of isolation and of parasitic current flow.

Figure 4:
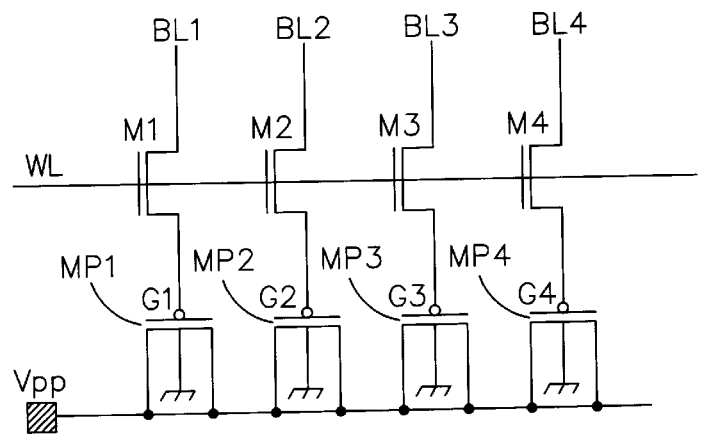
FIG. 4 shows a circuit associating memory points according to the present invention.

FIG. 4 shows a simple example in the form of a circuit of an assembly of memory points according to the present invention. Four memory points MP1 to MP4 have their drains and sources connected to a terminal Vpp, their substrate (or well) connected to the ground, and their gates G1 to G4 connected to lines BL1 to BL4 via N-channel MOS transistors M1 to M4, the gates of which are connected to a line WL (conventionally, WL refers to a word line of the memory, and BL refers to a bit line of this memory).

For programming, terminal Vpp is connected to a current source as has been previously indicated, line WL is addressed and lines BL1 to BL4 are, according to whether it is desired to program or not the corresponding transistor, set to VDD or to the ground by the decoder associated therewith.

In the read operation, terminal Vpp is left unconnected or grounded and each of lines BL1 to BL4 is addressed via a read amplifier which detects the current flowing therethrough.

It should be noted that, once a memory cell MP1 to MP4 has been programmed, its state is irreversible. It remains, however, possible to modify a circuit according to the present invention at any moment by turning an unprogrammed memory point into a programmed memory point. Similarly, logic circuits that inhibit programmed memory points could be provided to transfer the corresponding information to an unprogrammed memory point.

Figure 5:
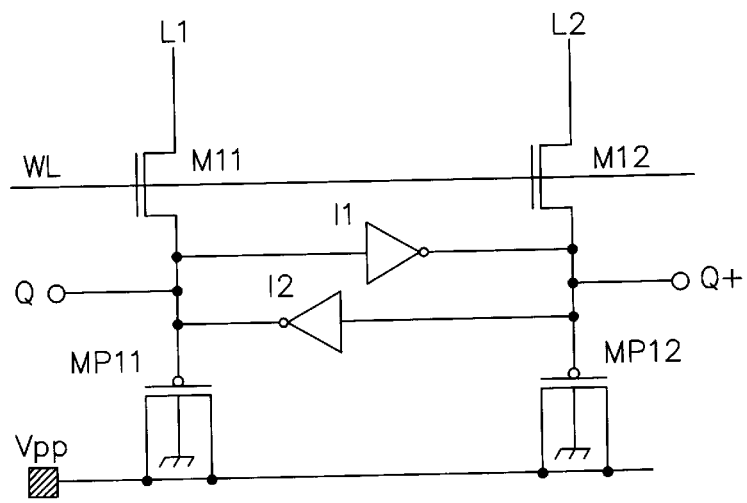

FIG. 5 shows an example of a flip-flop which takes a determined logic state after a power-on by means of memory points according to the present invention. The flip-flop is schematically shown in the form of two head-to-tail connected inverters I1 and I2. It includes complementary outputs Q and Q*. Two memory points MP1 and MP2 are respectively connected to the two outputs Q and Q*. Each memory point is connected to a programming line L1, L2 enabled via transistors M11 and M12 which can be enabled by a word line WL. The programming of one or the other of the memory points is performed in the way previously described and thus the flip-flop sets in a determined state. It should be noted that according to an advantage of the present invention, this flip-flop has no power consumption in the idle state.

Of course, the present invention is likely to have various alterations, modifications, and improvements which will readily occur to those skilled in the art. For example, in a technology of manufacturing of CMOS transistors on an N-type epitaxial layer, N-channel MOS transistors formed in P wells will preferably be used as a memory point according to the present invention. Further, even in a technology of CMOS transistors on a P-type epitaxial layer, memory points according to the present invention could be formed from N-channel MOS transistors, provided that a proper insulation is ensured, for example by double or triple well technologies.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for using a conventional MOS transistor as a memory point, in which:

during programming:
    a well of the MOS transistor is connected to a reference potential;
    a drain and a source are connected to a current source adapted to bias the drain and source junctions in reverse and in avalanche so that a space charge region extends along an entire channel length;
    a gate is set to the reference potential if the memory point does not have to be programmed and to a distinct potential if the memory point has to be programmed;

during reading, means are provided to detect a high or low impedance state between the gate and the well.

2. The memory point of claim 1, wherein the gate length of the MOS transistor is lower than 0.5 μm.

3. The memory point of claim 1, wherein the MOS transistor is a P-channel transistor formed in an N well of a P-type epitaxial layer.

* * * * *

UNITED STATES PATENT AND TRADEMARK OFFICE
CERTIFICATE OF CORRECTION

PATENT NO.    :    6,018,475
DATED         :    January 25, 2000
INVENTOR(S)   :    Constantin Papadas and Jean-Pierre Schoellkopf It is certified that error appears in the above-identified patent and that said Letters Patent is hereby corrected as shown below:

In column 3, line 15 should read as follows:

programmed device and a current of $10^{-10}$ to $10^{-1}$ 1 amperes

Signed and Sealed this

First Day of August, 2000

Attest:

Q. TODD DICKINSON

*Attesting Officer*          *Director of Patents and Trademarks*